(12) United States Patent
Bottarel et al.

(10) Patent No.: US 8,665,001 B2
(45) Date of Patent: Mar. 4, 2014

(54) LOW VOLTAGE ISOLATION SWITCH, IN PARTICULAR FOR A TRANSMISSION CHANNEL FOR ULTRASOUND APPLICATIONS

(75) Inventors: Valeria Bottarel, Novara (IT); Giulio Ricotti, Broni (IT); Fabio Quaglia, Pizzale (IT); Juri Giovannone, Cemobbio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/536,797

(22) Filed: Jun. 28, 2012

(65) Prior Publication Data
US 2012/0262221 A1  Oct. 18, 2012

Related U.S. Application Data (63) Continuation-in-part of application No. PCT/EP2010/005929, filed on Sep. 29, 2010.

(30) Foreign Application Priority Data

Dec. 30, 2009 (IT) .......................... MI2009A002344

(51) Int. Cl.
*H03K 17/16* (2006.01)
(52) U.S. Cl.
USPC ......................................... 327/382; 327/365
(58) Field of Classification Search
USPC .......... 327/112, 365, 369, 382, 389, 390, 427
See application file for complete search history.

(56) References Cited

U.S. PATENT DOCUMENTS

| | | | |
|---|---|---|---|
| 6,050,945 A | 4/2000 | Peterson et al. | |
| 6,269,052 B1 | 7/2001 | Oppelt | |
| 7,977,820 B2 * | 7/2011 | Chu et al. | 307/106 |
| 8,465,432 B2 * | 6/2013 | Franchini et al. | 600/459 |
| 2009/0206676 A1 | 8/2009 | Chu et al. | |
| 2012/0313689 A1 * | 12/2012 | Bottarel et al. | 327/434 |

FOREIGN PATENT DOCUMENTS

DE    198337585 U1    4/1985

OTHER PUBLICATIONS

Lockwood et al., "The Design of Protection Circuitry for High-Frequency Ultrasound Imaging Systems," IEEE Transactions on Ultrasonics, Ferroelectrics, and Frequency Control 38(1):48-55, Jan. 1991.

* cited by examiner

*Primary Examiner* — Jeffrey Zweizig
(74) *Attorney, Agent, or Firm* — Seed IP Law Group PLLC (57) ABSTRACT

A low voltage isolation switch is coupled between an input terminal suitable for receiving a high voltage signal and an output terminal suitable for transmitting this high voltage signal to a load. The isolation switch includes a first driving transistor coupled between a first reference terminal and an intermediate node, a second driving transistor coupled between the intermediate node and the second reference terminal, a control transistor connected across a diode block coupled between the input and output terminals. The control transistor has a control terminal connected to the intermediate node through a low voltage decoupling block that includes first and second substrate terminals, first and second parasitic capacitive element connected to these first and second substrate terminals, and first and second decoupling transistors coupled in parallel to each other and having control terminals connected to the first and second parasitic capacitive elements, respectively.

25 Claims, 7 Drawing Sheets

LOW VOLTAGE ISOLATION SWITCH, IN PARTICULAR FOR A TRANSMISSION CHANNEL FOR ULTRASOUND APPLICATIONS

BACKGROUND

1. Technical Field

The present disclosure relates to a low voltage switch. The disclosure also relates to a transmission channel of a high voltage signal to a load, in particular a piezoelectric transducer and to a corresponding driving method. The disclosure particularly, but not exclusively, relates to a low voltage switch for a transmission channel for ultrasound applications and the following description is made with reference to this field of application by way of illustration only.

2. Description of the Related Art

As it is well known, sonography or ultrasonography is a system of medical diagnostic testing that uses ultrasonic waves or ultrasounds and is based on the principle of the transmission of the ultrasounds and of the emission of echoes and is widely used in the internal medicine, surgical and radiological fields.

The ultrasounds normally used are comprised between 2 and 20 MHz. The frequency is chosen by taking into consideration that higher frequencies have a greater image resolving power, but penetrate less in depth in the subject under examination.

These ultrasounds are normally generated by a piezoceramic crystal inserted in a probe maintained in direct contact with the skin of the subject with the interposition of a suitable gel (suitable for eliminating the air between probe and subject's skin, allowing the ultrasounds to penetrate into the anatomic segment being examined). The same probe is able to collect a return signal or echo, which is suitably processed by a computer and displayed on a monitor.

In particular, the ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with sonography it is not possible to see behind a bone, which causes a total reflection of the ultrasounds, while air or gas zones give "shade", causing a partial reflection of the ultrasounds.

The time employed by an ultrasonic wave for travelling across the path of transmission, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, typically comprises three parts:
- a probe comprising at least one transducer, in particular of the ultrasonic type, which transmits and receives an ultrasound signal;
- an electronic system that drives the transducer for the generation of the ultrasound signal or pulse to be transmitted and receives an echo signal of return of this pulse at the probe, processing in consequence the received echo signal; and
- a displaying system of a corresponding processed sonographic image starting from the echo signal received by the probe.

In particular, the word transducer generally indicates an electric or electronic device that converts a type of energy relative to mechanical and physical quantities into electric signals. In a broad sense, a transducer is sometimes defined as any device that converts energy from a form to another, so that it can be re-processed either by men or by other machines. Many transducers are both sensors and actuators. An ultrasonic transducer usually comprises a piezoelectric crystal that is suitably biased for causing its deformation and the generation of the ultrasound signal or pulse.

Ultrasonic transducers for sonographic images are usually driven by high voltage driving circuits or drivers able to generate a sinusoidal signal of variable width comprised between 3 and 200 Vpp and frequencies from 1 MHz to 20 MHz, this sinusoidal signal being a control signal for corresponding generators of the ultrasound pulse to be transmitted, in particular piezoelectric crystals.

The corresponding driving circuits are thus made of components that can sustain these high voltages and that, given the frequencies at stake, can supply currents high enough to a load applied at the output, in particular an ultrasonic transducer.

As a result, prior art ultrasonic transducer driving circuits use components with rather big sizes. These components however add high parasitic capacitances in parallel to the transducer.

Figure 1:
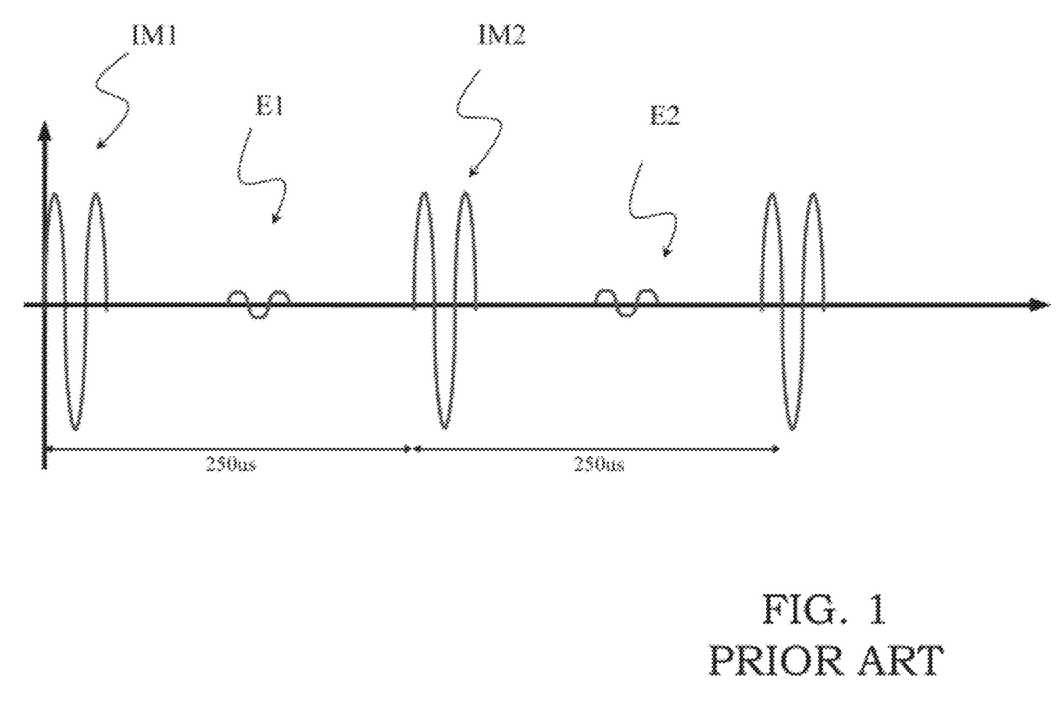
FIG. 1 schematically shows a first and a second ultrasound pulse generated by a driving circuit and thereby applied to an ultrasonic transducer according to the prior art.

Moreover, the transducer itself is used also for the reception in a transmission channel for these ultrasound applications. Typically, an ultrasonic transducer transmits a high voltage pulse of the duration of a few us, and receives the echo of this pulse, generated by the reflection on the organs of a subject under examination, for the duration of about 250 us, and then returns to the transmission of a new high voltage pulse. For example, a first pulse IM1 and a second pulse IM2 are transmitted with an excursion peak to peak equal, in the example shown, to 190 Vpp with reception by the transducer of corresponding echoes, indicated with E1 and E2, as schematically shown in FIG. 1.

The echo signal or return acoustic wave is converted into an electric wave that is a signal of some millivolts of width, signal that is then amplified by low noise amplifier circuits, connected to the transducer itself, in turn disturbed by the parasitic capacitance due to the high voltage components of the driving circuit of the transducer. This reduces the quality of the echo signal.

BRIEF SUMMARY

One embodiment of the present disclosure reduces the effect of the parasitic capacitances of the high voltage components of a driving circuit, in particular for an ultrasonic transducer in a transmission channel for ultrasound applications, having such structural and functional features as to ensure a correct transmission in this transmission channel of high voltage signals for the transmission of an ultrasonic pulse to an output terminal connected to this transducer, and at the same time ensures the correct isolation of this terminal when receiving an echo signal, overcoming in this way the limits and/or drawbacks still limiting the systems realized according to the prior art.

One embodiment of the present disclosure uses an isolation switch realized with low voltage components, so that they have a very reduced parasitic capacitance, this switch being electrically coupled in the transmission channel interposed between the output terminal connected to the ultrasonic transducer and the high voltage components of the driving circuit.

One embodiment of the present disclosure is a low voltage isolation switch electrically coupled between an input terminal suitable for receiving a high voltage signal and an output terminal suitable for transmitting said high voltage signal to a load. The low voltage isolation switch includes at least one driving block electrically coupled between a first and a second voltage reference and comprising a first driving transistor electrically coupled in series with a first driving diode between said first voltage reference and a first driving central circuit node and a second driving transistor electrically coupled in series with a second driving diode between said driving central circuit node and said second supply voltage reference. The low voltage isolation switch also includes a control transistor connected across a diode block comprising at least one first and one second transmission diode, connected in antiparallel, i.e., by having the anode terminal of the first diode connected to the cathode terminal of the second one and vice versa, between said input and output terminals of said low voltage isolation switch. The control transistor has a control terminal connected to said driving central circuit node through a low voltage decoupling block, in turn electrically coupled between a first and a second substrate terminal and comprising a first and a second parasitic capacitive element connected to said first and second substrate terminals, as well as comprising at least one first decoupling transistor and one second decoupling transistor electrically coupled in parallel to each other and having control terminals connected to the first and second parasitic capacitive elements, respectively.

More in particular, the disclosure comprises the following supplementary and optional features, taken alone or, if need be, in combination.

According to one embodiment of the disclosure, said low voltage decoupling block may comprise an input resistive element electrically coupled between said driving central circuit node and a first inner circuit node, the first decoupling transistor being electrically coupled between said first inner circuit node and a second inner circuit node and the second decoupling transistor being electrically coupled in parallel to said first decoupling transistor, between said first and second inner circuit nodes.

According to one embodiment of the disclosure, said first decoupling transistor may have a control terminal connected to a third inner circuit node, in turn connected to said second inner circuit node through a first decoupling resistive element, as well as to said first substrate terminal and said second decoupling transistor may have a control terminal connected to a fourth inner circuit node, in turn connected to said first inner circuit node through a second decoupling resistive element, as well as to said second substrate terminal.

Further, according to one embodiment of the disclosure, said diode block may comprise the first and second transmission diodes, connected in antiparallel, between said output terminal and said low voltage decoupling block in correspondence with said second inner circuit node.

According to one embodiment of the disclosure, said first driving transistor of said driving block may have a control terminal receiving a first driving signal and said second driving transistor has a control terminal connected to a level shifter receiving in turn a second driving signal.

Moreover, according to one embodiment of the disclosure, said first driving transistor may be a P channel MOS transistor and said second driving transistor may be an N channel MOS transistor.

According to one embodiment of the disclosure, said control transistor may be a diode-like configured low voltage N channel MOS transistor.

According to one embodiment of the disclosure, said first decoupling transistor may be a diode-like configured low voltage N channel MOS transistor and said second decoupling transistor may be a diode-like configured low voltage P channel MOS transistor.

Moreover, according to one embodiment of the disclosure, said low voltage isolation switch may be realized on a substrate of the SOI type and said first and second parasitic capacitive elements can be realized by means of doped wells implanted in said substrate of the SOI type.

One embodiment of the present disclosure is a transmission channel for transmitting a high voltage signal from an input terminal via a connection terminal to a load. The transmission channel includes a matrix of high voltage switches electrically coupled between said input terminal and a first high voltage output terminal, a second low voltage output terminal connected to a transconductance cell, a transmission switch connected between said first output terminal and said second output terminal, and at least one low voltage isolation switch realized as above indicated and having an input terminal connected to said first output terminal and an output terminal connected to said connection terminal.

According to one embodiment of the disclosure, said transmission channel may comprise an array comprising a plurality of low switch isolation switches, connected in series to a plurality of channels of said matrix of switches and suitable for isolating a corresponding array of a plurality of loads.

Moreover, according to one embodiment of the disclosure, said transmission channel may be used for the transmission of an ultrasound pulse as high voltage signal, said load being a piezoelectric transducer.

One embodiment of the present disclosure is a driving method for driving a transmission channel as above described. The method comprises:
  a transmission mode of said high voltage signal to said connection terminal to said load in which said matrix of switches is turned on, said transmission switch is switched off and said high voltage signal is transmitted through said low voltage isolation switch, and in particular through said diode block;
  a first receiving mode of an echo signal through said transmission switch in which said matrix of switches and said low voltage isolation switch are switched off and said transmission switch is turned on, said echo signal flowing from said connection terminal toward said output terminal and then to said transconductance cell; and
  a second receiving mode of an echo signal through said matrix of switches in which said matrix of switches and said low voltage isolation switch are turned on and said transmission switch is switched off, said echo signal flowing from said connection terminal toward said first output terminal and then to said input terminal.

According to one embodiment of the disclosure, in said transmission mode, said control transistor may be switched off by turning on said second driving transistor of said driving block and said high voltage signal may be transmitted through said first and second transmission diodes of said diode block bringing said first driving signal to a first high value and said second driving signal to a second low value, said low voltage decoupling block preventing a capacitive coupling of said second driving transistor.

According to one embodiment of the disclosure, in said transmission mode, said low voltage decoupling block may have the following operation:
  a. on the positive edges of said high voltage signal, said second decoupling transistor is turned on thanks to a voltage drop that develops on said second resistive element connected between its gate and source terminals and to a charge current flowing in said second parasitic capacitive element that acts as an active element for activating said second driving transistor;

b. on the negative edges of said high voltage signal said first decoupling transistor is turned on thanks to a voltage drop that develops on said first resistive element connected between its gate and source terminals and to a charge current flowing in said first parasitic capacitive element that acts as an active element for activating said first transistor.

Further, according to one embodiment of the disclosure, prior to said first receiving mode, said control transistor may be switched off and said second driving transistor may be turned on, while said first driving transistor is switched off.

According to one embodiment of the disclosure, in said first receiving mode, said transmission switch may be closed for transferring said echo signal to said second output terminal, said first and second driving signals being both brought to a first high value.

According to another aspect of the disclosure, in said second receiving mode, said control transistor may be turned on, said first driving transistor is turned on and said second driving transistor may be switched off while said transmission switch is kept open so that said echo signal reaches the matrix of switches through said control transistor, said first and second driving signals being both brought to a second low value.

The features and the advantages of the low voltage isolation switch, of the transmission channel and of the driving method will be apparent from the following description of an embodiment thereof given by way of indicative and non-limiting example with reference to the annexed drawings.

DETAILED DESCRIPTION

With reference to these figures, and in particular to FIGS. 2A, 2B and 2C, 10 globally and schematically indicates a transmission channel of an impulsive signal for an ultrasound transducer, in particular a piezoelectric transducer PZ.

Figure 2A:
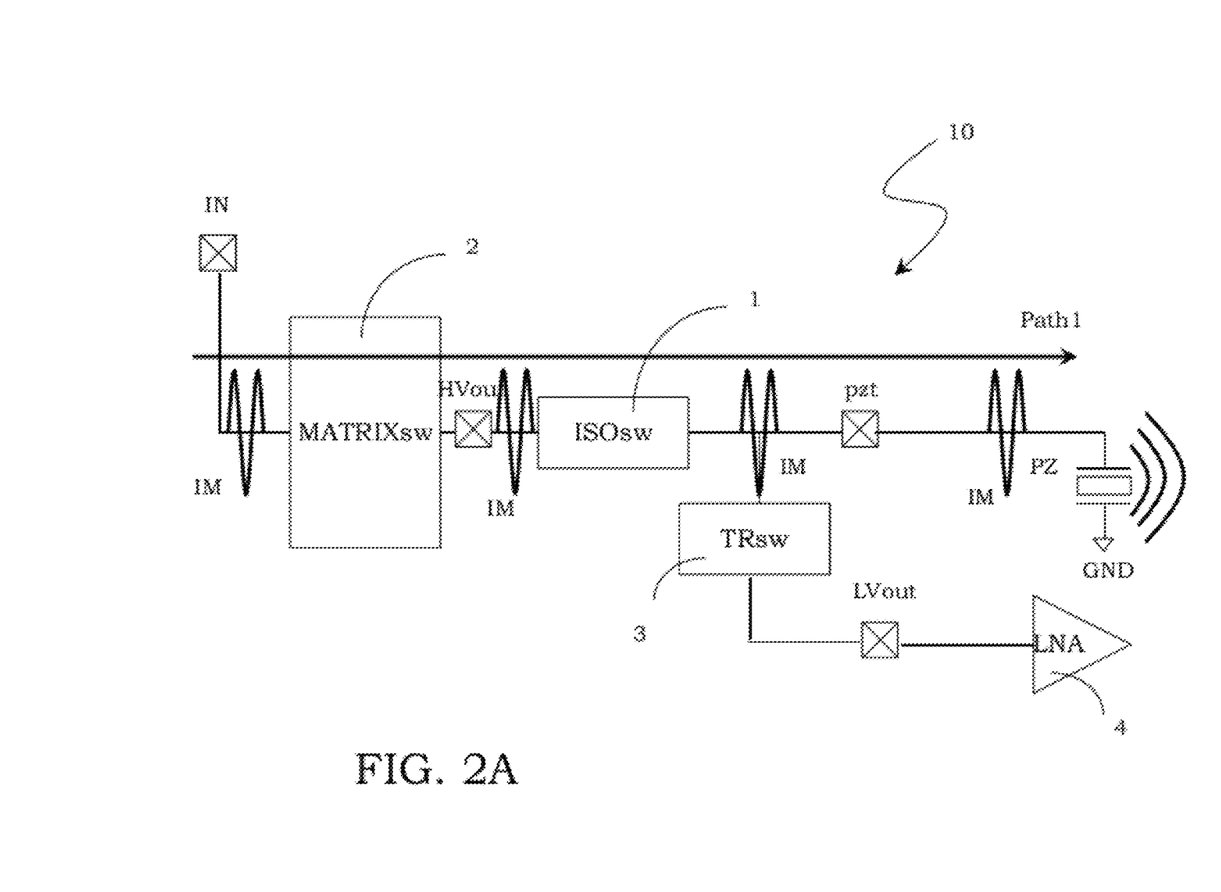
FIGS. 2A, 2B and 2C schematically show a transmission channel for ultrasound applications realized according to the disclosure, according to a first, a second and in a third operation condition, respectively.
Figure 2B:
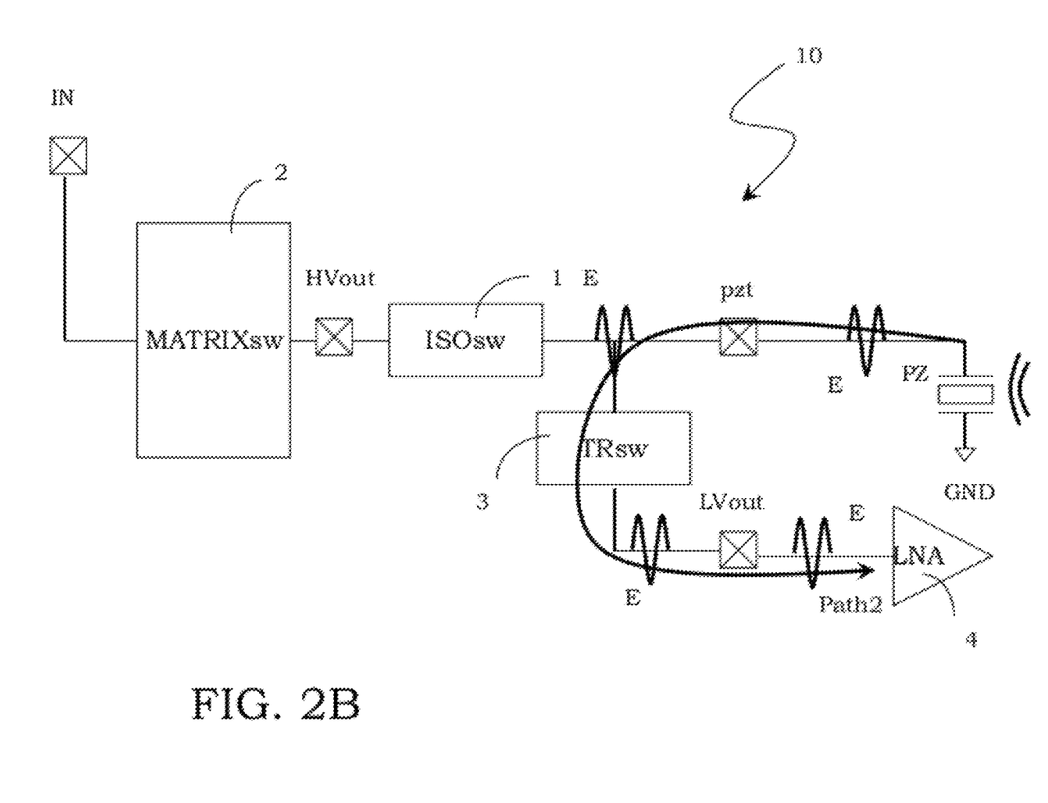
Figure 2C:
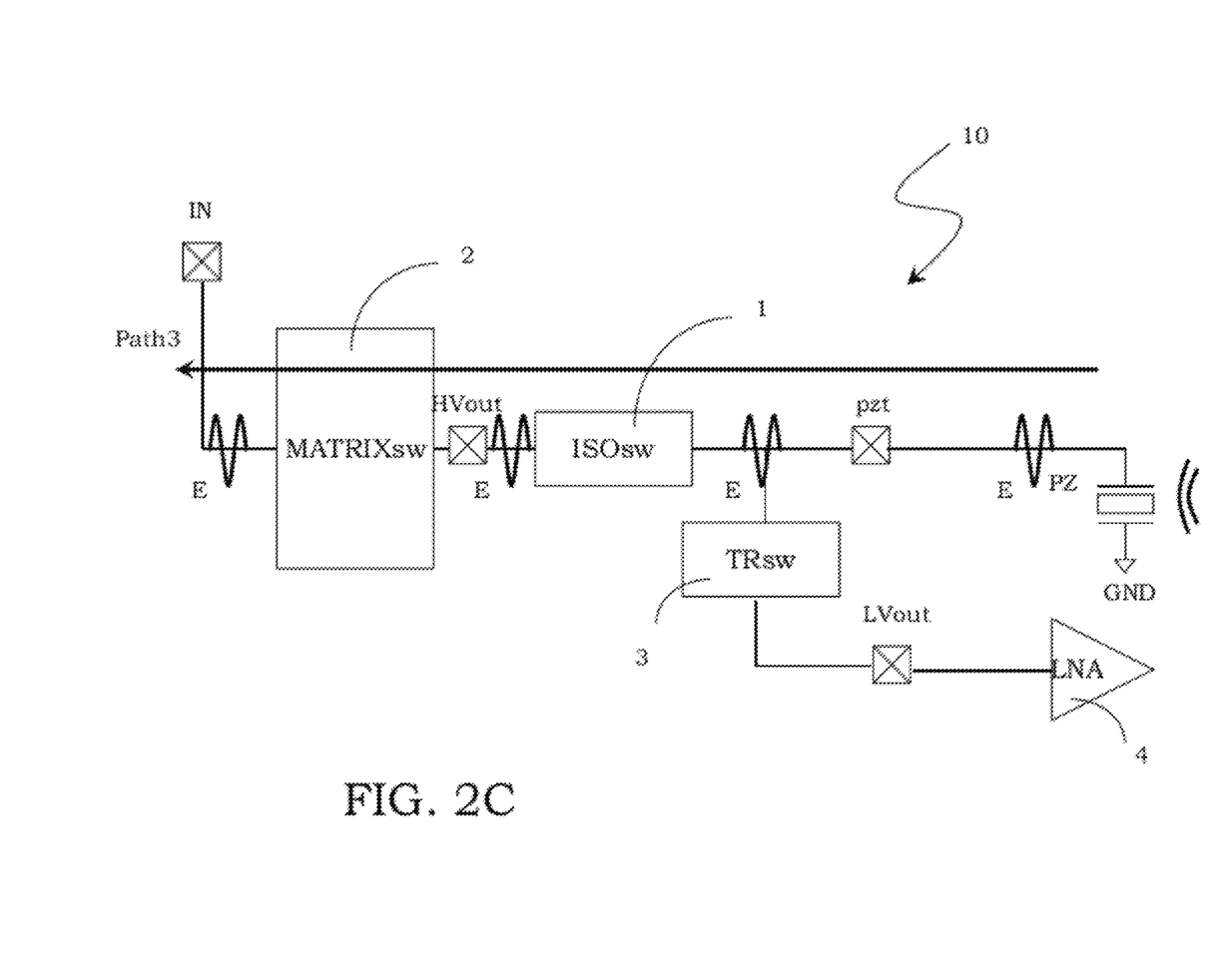

By way of illustration, only an output section of the transmission channel 10 has been actually shown, which is connected to the piezoelectric transducer PZ and supplies it with an impulsive signal IM generated by suitable circuitry (not shown) and already present on an input terminal IN.

In particular, the transmission channel 10 firstly comprises a matrix (MATRIXsw) 2 of high voltage switches electrically coupled between the input terminal IN and a first high voltage output terminal HVout, whereon the input impulsive signal IM is transmitted.

Furthermore, the transmission channel 10 comprises a second low voltage output terminal LVout suitable for being connected to a transconductance cell 4 (LNA) and via a connection terminal pzt to a piezoelectric transducer PZ. Furthermore, the transmission channel 10 comprises at least one transmission switch 3 (TRsw) connected between the first output terminal HVout and the second output terminal LVout.

According to an embodiment of the disclosure, the transmission channel 10 also comprises an isolation switch 1 (ISOsw), in particular a low voltage switch, electrically coupled between the first output terminal HVout and the connection terminal pzt. In this way, the first output terminal HVout is connected to the second output terminal LVout through the series of the low voltage isolation switch 1 and of the transmission switch 3.

The use of the low voltage isolation switch 1 allows to overcome the problem of the high parasitic capacitance due to the high voltage components of the matrix 2 of switches. In particular, as it will be clarified hereafter in the description, this low voltage isolation switch 1 comprises only low voltage components that have a very reduced parasitic capacitance.

According to a first operation condition, in particular a transmission mode in which a pulse IM is transmitted via the connection terminal pzt to the piezoelectric transducer PZ, as shown in FIG. 2A according to the path indicated as Path1, the matrix 2 of switches is turned on for transmitting this pulse IM from the input terminal IN to the first output terminal HVout. Moreover, the transmission switch 3 is switched off and the pulse IM is transmitted through the low voltage isolation switch 1, thanks to the presence into the low voltage isolation switch 1 of a diode block 7 connected to the connection terminal pzt, as it will be explained hereafter in the description.

According to a second operation condition, in particular a receiving mode of an echo signal E through the transmission switch 3, as shown in FIG. 2B according to the path indicated as Path2, the matrix 2 of switches and the low voltage isolation switch 1 are switched off and the transmission switch 3 is turned on, the echo signal E flowing from the connection terminal pzt to the piezoelectric transducer PZ toward the second output terminal LVout and then to the transconductance cell 4.

Finally, according to a third operation condition, in particular a second receiving mode of an echo signal E through the matrix 2 of switches, as shown in FIG. 2C according to the path indicated as Path3, the matrix 2 of switches and the low voltage isolation switch 1 are turned on and the transmission switch 3 is switched off, the echo signal E flowing from the piezoelectric transducer PZ to the connection terminal pzt, toward the first output terminal HVout, and then to the input terminal IN.

Figure 3:
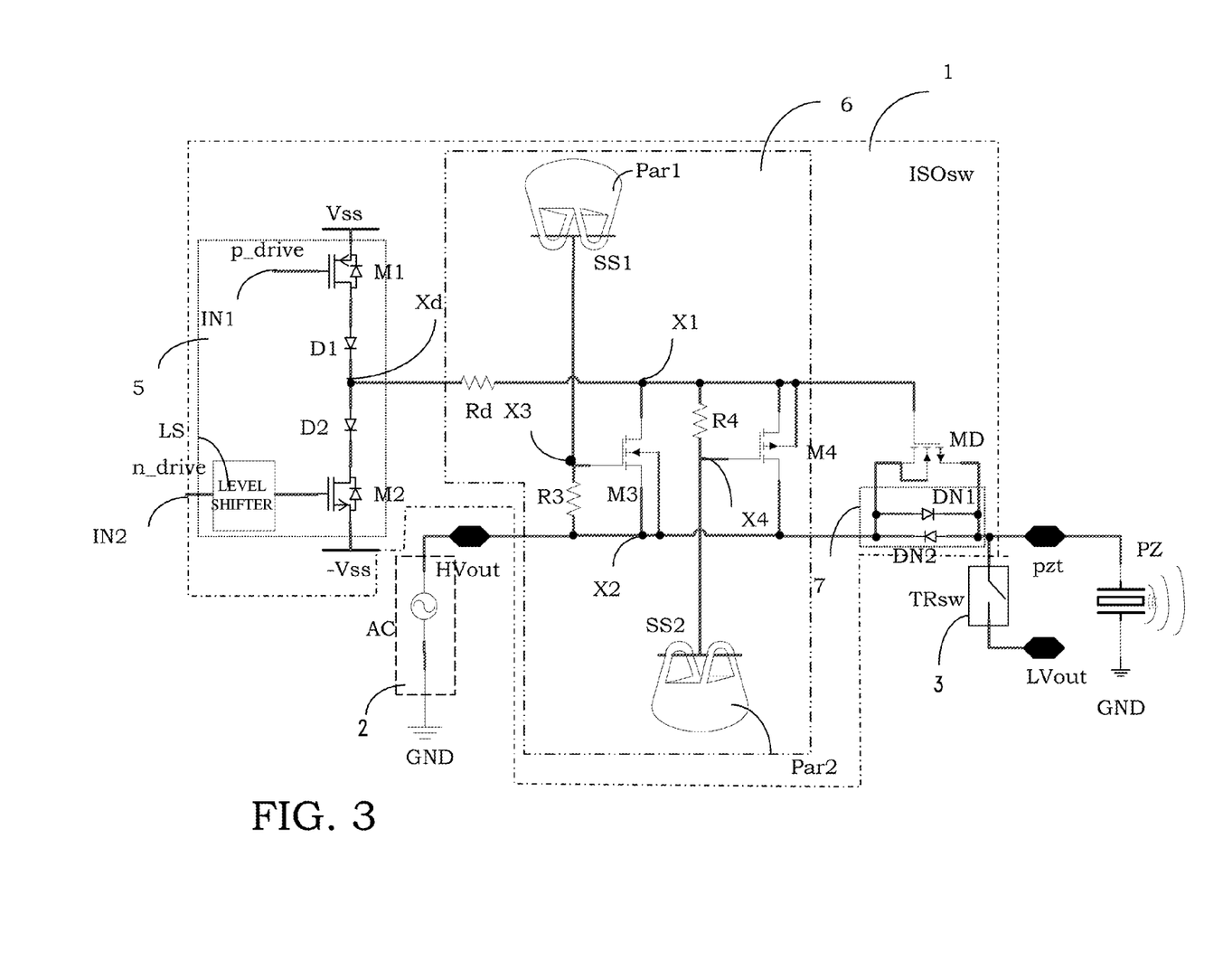
FIG. 3 schematically shows a low voltage switch realized according to the disclosure.

The low voltage isolation switch 1 according to one embodiment of the disclosure is shown in greater detail in FIG. 3.

In particular, by way of illustration, in this FIG. 3, the matrix 2 of switches is simply indicated as high voltage block AC connected to the first output terminal HVout.

The first output terminal HVout of the matrix 2 of switches is an input terminal of the low voltage isolation switch 1 and is suitable for receiving a high voltage signal, while the connection terminal pzt is an output terminal of the low voltage isolation switch 1 and is suitable for transmitting this high voltage signal to a load, in particular the piezoelectric transducer PZ.

The low voltage isolation switch 1 comprises a driving block 5 electrically coupled between a first and a second voltage reference, respectively a positive supply Vss and a negative supply −Vss, and comprises a first driving transistor M1 electrically coupled in series with a first driving diode D1 between the positive supply voltage reference Vss and a first driving central circuit node Xd and having a control or gate terminal receiving a first driving signal, p_drive.

The driving block 5 also comprises a second driving transistor M2 electrically coupled in series with a second driving diode D2 between the driving central circuit node Xd and the negative supply voltage reference −Vss and having a control or gate terminal connected to a level shifter LS (LEVEL SHIFTER) receiving in turn a second driving signal n_drive. In particular, the level shifter LS is configured to adapt the voltage levels of the first driving signal n_drive, usually generated by a logic circuitry and thus plausibly with a low logic level or "0" corresponding to a ground value GND and a high logic level or "1" corresponding to a positive supply voltage value Vss. The level shifter LS is thus a logic level shifter of form [Vss; 0] to [0; −Vss].

In the embodiment of FIG. 3, the first driving transistor M1 is a P channel MOS transistor, while the second driving transistor M2 is an N channel MOS transistor. Moreover, these driving transistors are high voltage transistors, since on the first output terminal HVout a high voltage signal is present, transferred in consequence to the driving central circuit node Xd, that follows the value of this first output terminal HVout, decreased by a value equal to the positive supply voltage Vss, if any, when the transistor M4 is on, with a high voltage dynamic that is sustained according to an inverse condition by the driving transistors, M1 and M2.

The low voltage isolation switch 1 also comprises a control transistor MD having a control or gate terminal connected to the driving central circuit node Xd through a low voltage decoupling block 6. This control transistor MD is in particular connected to the ends of a diode block 7 in turn connected to the connection terminal pzt and comprising at least one first DN1 and one second transmission diode DN2, connected in antiparallel, i.e., by having the anode terminal of the first diode connected to the cathode terminal of the second one and vice versa, between this connection terminal pzt and the low voltage decoupling block 6. In particular, the first transmission diode DN1 has its cathode terminal connected to the connection terminal pzt and its anode terminal connected to the low voltage decoupling block 6, while the second transmission diode DN2 has its anode terminal connected to the connection terminal pzt and its cathode terminal connected to the low voltage decoupling block 6.

In the example of the figure, the control transistor MD is a low voltage diode-like configured N channel MOS transistor.

According to an embodiment of the disclosure, the low voltage decoupling block 6 comprises an input resistive element Rd electrically coupled between the driving central circuit node Xd and a first inner circuit node X1, as well as a first decoupling transistor M3 electrically coupled between this first inner circuit node X1 and a second inner circuit node X2 and having a control or gate terminal connected to a third inner circuit node X3, in turn connected to the second inner circuit node X2 through a first decoupling resistive element R3, as well as to a first substrate terminal SS1.

Furthermore, the low voltage decoupling block 6 comprises a second decoupling transistor M4 electrically coupled, in parallel to the first decoupling transistor M3, between the first X1 and the second inner circuit node X2 and having a control or gate terminal connected to a fourth inner circuit node X4, in turn connected to the first inner circuit node X1 through a second decoupling resistive element R4, as well as to a second substrate terminal SS2.

In particular, the diode block 7 is connected to the low voltage decoupling block 6 in correspondence with the second inner circuit node X2.

In the example of the figure, the first decoupling transistor M3 is a low voltage diode-like configured N channel MOS transistor, while the second decoupling transistor M4 is a low voltage diode-like configured P channel MOS transistor.

According to an embodiment of the disclosure, the low voltage decoupling block 6 also comprises a first parasitic capacitive element Par1 connected to the first substrate terminal SS1 and having a first capacitive value Cp1 and a second parasitic capacitive element Par2 connected to the second substrate terminal SS2 and having a second capacitive value Cp2, whose operation will be described hereafter.

In a preferred embodiment, the low voltage isolation switch 1 is realized on a substrate of the SOI type. Moreover, the first and second parasitic capacitive elements, Par1 and Par2, are realized by means of doped wells implanted in this substrate SOI.

Figure 4:
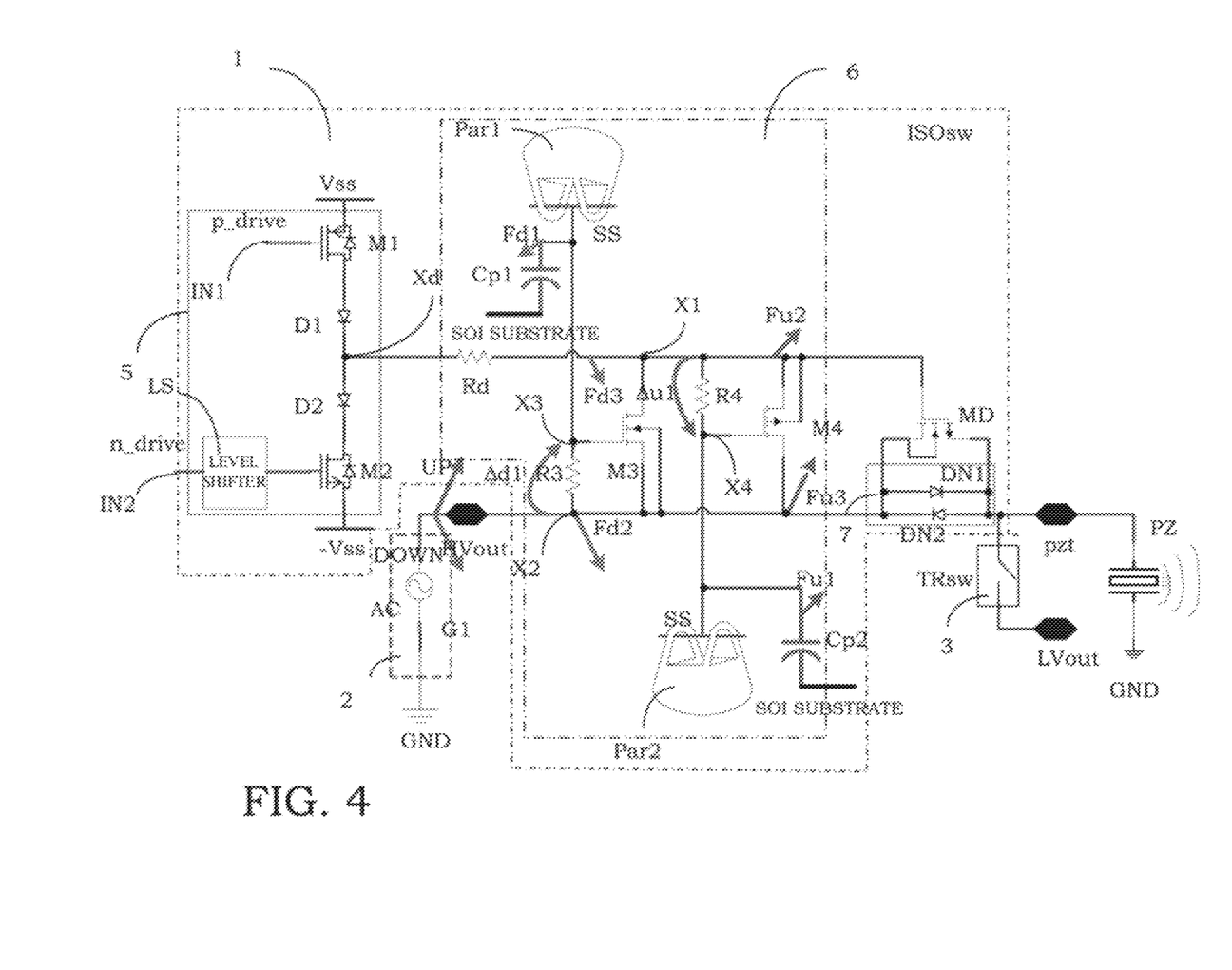
FIG. 4 schematically shows the operation of the switch of FIG. 3 according to different operation conditions of the same.

Let's now see the operation principle of the low voltage isolation switch 1, making reference in particular to FIG. 4.

According to the first operation condition, in particular of transmission, a high voltage pulse is on the first output terminal HVout and should be transferred to the connection terminal pzt to the piezoelectric transducer PZ. Prior to this transmission, the control transistor MD is switched off by turning on the second driving transistor M2 of the driving block 5. In this way in fact the gate-source capacitance of the control transistor MD is suitably discharged and the high voltage pulse is transmitted through the transmission diodes DN1 and DN2 of the diode block 7, suitably in push-pull. In this case, the first driving signal p_drive is brought to a first high value (for example equal to 3.3V) while the second driving signal n_drive is brought to a second low value (in particular 0V).

It is to be noted that for ultrasound applications, the high voltage pulse applied to the first output terminal HVout has high peak to peak values (~200V) and high slopes (~5V/ns), with the risk of breakage of the gate oxide of the second driving transistor M2, considering the values reached due to the coupling of its gate-source voltage. According to an embodiment of the disclosure, the low voltage decoupling block 6 prevents this capacitive coupling thanks to the presence of the first M3 and second decoupling transistor M4 and of the parasitic capacitive elements Par1 and Par2 that operate as driving circuits of the gate-source voltage of these transistors M3 and M4.

In particular, the low voltage decoupling block 6 has the following operation (as shown in FIG. 4):

a. On the positive edges (arrow UP) of the input high voltage pulse being on the first output terminal HVout of the matrix 2 of switches, the second decoupling transistor M4 is turned on thanks to the voltage drop (Δu1) that develops on the second resistive element R4 connected between its gate and source terminals. In fact, a charge current (Fu1) flows in the second parasitic capacitive element Par2 towards the substrate.

The second parasitic capacitive element Par2 (having a parasitic capacitance equal to Cp2 towards the substrate SOI SUBSTRATE) acts as active element for activating the second driving transistor M4 (Fu2 and Fu3).

b. On the negative edges (arrow DOWN) of the input high voltage pulse on the first output terminal HVout of the matrix 2 of switches, the operation of the low voltage decoupling block 6 is mirrored for the first decoupling transistor M3. In particular, the first decoupling transistor M3 is turned on thanks to the voltage drop (Δd1) that develops on the first resistive element R3 connected between its gate and source terminals. In fact, a charge current (Fd1) flows in the first parasitic capacitive element Par1 towards the substrate.

In substance, the first parasitic capacitive element Par1 (having a parasitic capacitance equal to Cp1 towards the substrate SOI SUBSTRATE) acts as an active element for activating the first driving transistor M3 (Fd2 and Fd3).

According to the second operation condition, in particular when receiving an echo signal through the transmission switch 3, the control transistor MD allows to isolate the matrix 2 of switches and thus to reduce the parasitic capacitive load being seen by the piezoelectric transducer PZ. In this case, the control transistor MD is then switched off prior to the arrival of this echo signal. In particular, prior to the arrival of the echo signal, the second driving transistor M2 is turned on and the first driving transistor M1 is switched off. In this way, by closing the transmission switch 3, the echo signal is transferred to the second output terminal LVout and then, as previously seen, to the transconductance cell 4. In this case, the first driving signal p_drive and the second driving signal n_drive di are both brought to the first high value (for example equal to 3.3V).

According to the third operation condition, in particular when receiving the echo signal through the matrix 2 of switches, the control transistor MD is turned on. In particular, the first driving transistor M1 is turned on and the second driving transistor M2 is switched off while the transmission switch 3 is kept open. The echo signal thus reaches the matrix 2 of switches exactly through the control transistor MD. In this case, the first driving signal p_drive and the second driving signal n_drive are both brought to the second low value (for example equal to 0V).

It is to be noted that the first and second parasitic capacitive elements Par1 and Par2 behave as "parachutes" for the inner circuit nodes X3 and X4 they are connected to.

Figure 5:
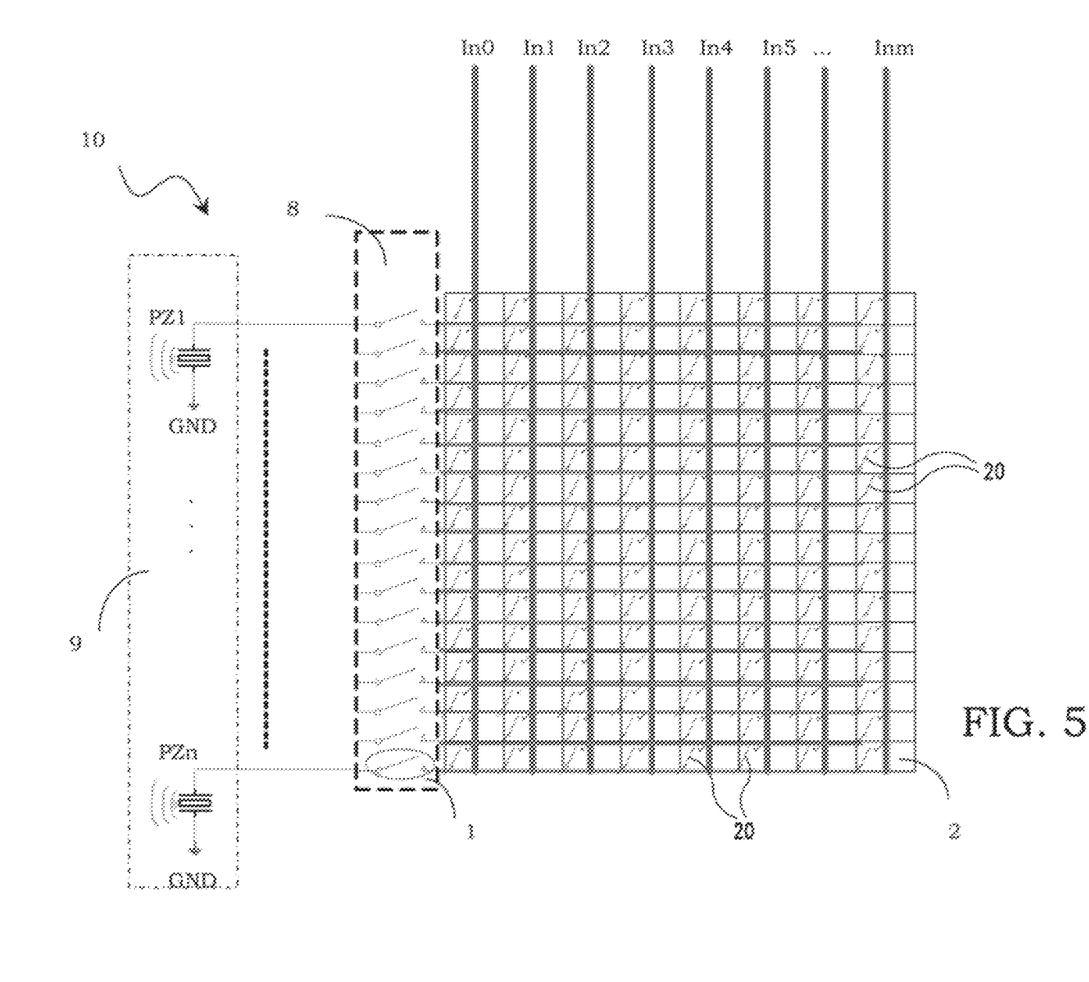
FIG. 5 shows an embodiment of the transmission channel of FIGS. 2A-2C for the driving of a plurality of piezoelectric transducers.

According to an embodiment of the disclosure, as shown in FIG. 5, a transmission channel 10 comprises an array 8 of low voltage isolation switches 1 connected in series to a plurality of channels of the matrix 2 of switches 20 and suitable for isolating a corresponding array 9 of piezoelectric transducers PZ1 . . . PZn. The matrix 2 of switches 20 also comprises a plurality of control terminals In1 . . . Inm for the driving of the columns of switches 20.

In conclusion, the low voltage switch 1 as described is able to transmit high voltage signals (for example at +/−100V) or to isolate, when open, a terminal of connection to a piezoelectric transducer, thus ensuring a high immunity to the capacitive couplings of a corresponding input signal, ensuring at the same time a correct operation of the transmission channel that comprises it under all its operation conditions.

According to one embodiment of the disclosure, the low voltage decoupling block 6 comprises a pair of decoupling transistors, M3 and M4, which are connected in parallel to each other and have control or gate terminals connected to the parasitic capacitive elements, Par1 and Par2, respectively, such decoupling transistors being thus dynamically controlled by having their control terminals capacitively coupled to one of the substrate terminals, SS1 and SS2.

Obviously, a technician of the field, with the aim of meeting incidental and specific needs, will be allowed to introduce several modifications and variations to the above described circuit, all within the scope of protection of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low voltage isolation switch, comprising:
an input terminal configured to receive a high voltage signal;
an output terminal configured to transmit said high voltage signal to a load;
first and second voltage reference terminals configured to receive first and second voltage references, respectively;
a driving block electrically coupled between the first and second voltage reference terminals and including:
a first driving transistor electrically coupled between said first voltage reference terminal and a first intermediate node; and
a second driving transistor electrically coupled between said first intermediate node and said second voltage reference terminal;
a diode block electrically coupled between said input and output terminals
a control transistor electrically coupled across the diode block and having a control terminal; and
a low voltage decoupling block electrically coupled between the first intermediate node and the control terminal of the control transistor.

2. The low voltage isolation switch according to claim 1, wherein the low voltage decoupling block includes:
first and second substrate terminals;
first and second parasitic capacitive elements electrically coupled to said first and second substrate terminals; and
a first decoupling transistor and a second decoupling transistor electrically coupled in parallel to each other and having control terminals electrically coupled to said first and second parasitic capacitive elements, respectively.

3. The low voltage isolation switch according to claim 2, wherein said low voltage decoupling block comprises an input resistive element electrically coupled between said first intermediate node and a second intermediate node, said first decoupling transistor is electrically coupled between said second intermediate node and a third intermediate node; and said second decoupling transistor is electrically coupled in parallel to said first decoupling transistor between said second and third intermediate nodes.

4. The low voltage isolation switch according to claim 3, wherein:
said first decoupling transistor has a control terminal electrically coupled to a fourth intermediate node;
the decoupling block includes a first decoupling resistive element electrically coupled between said first substrate terminal and said third intermediate node;
said second decoupling transistor has a control terminal electrically coupled to a fifth intermediate node; and
the decoupling block includes a second decoupling resistive element electrically coupled between said second substrate terminal and said second intermediate node.

5. The low voltage isolation switch according to claim 2, wherein said first decoupling transistor is a diode-configured low voltage N channel MOS transistor and said second decoupling transistor is a diode-configured low voltage P channel MOS transistor.

6. The low voltage isolation switch according to claim 2, comprising an SOI substrate, said first and second parasitic capacitive elements include doped wells implanted in said SOI substrate, respectively.

7. The low voltage isolation switch according to claim 1, wherein said diode block comprises first and second transmission diodes electrically coupled in antiparallel between said input and output terminals.

8. The low voltage isolation switch according to claim 1, wherein:
the driving block includes a first driving diode coupled in series with the first driving transistor between the first voltage reference terminal and the first intermediate node;
the driving block includes a second driving diode coupled in series with the second driving transistor between the second voltage reference terminal and the first intermediate node;
said first driving transistor of said driving block has a control terminal configured to receive a first driving signal;
said second driving transistor has a control terminal; and
said driving block includes a level shifter coupled to the control terminal of the second driving transistor and configured to receive a second driving signal.

9. A transmission channel, comprising:
an input terminal;
a connection terminal configured to transmit a high voltage signal to a load;
a high voltage terminal;
a matrix of high voltage switches electrically coupled between said input terminal and the high voltage terminal; and
a low voltage isolation switch including:
an input terminal electrically coupled to said high voltage terminal;
an output terminal electrically coupled to said connection terminal;
first and second voltage reference terminals configured to receive first and second voltage references, respectively;
a driving block electrically coupled between the first and second voltage reference terminals and including:
a first driving transistor electrically coupled between said first voltage reference and a first intermediate node; and
a second driving transistor electrically coupled between said first intermediate node and said second voltage reference terminal;
a diode block electrically coupled between said input and output terminals;
a control transistor electrically coupled across the diode block and having a control terminal; and
a low voltage decoupling block electrically coupled between the first intermediate node and the control terminal of the control transistor.

10. The transmission channel according to claim 9, wherein said matrix of high voltage switches include a plurality of channels and the low voltage isolation switch is part of an array of a plurality of low voltage isolation switches electrically coupled to the plurality of channels of said matrix of high voltage switches, respectively, and suitable for isolating a corresponding array of a plurality of loads.

11. The transmission channel according to claim 9, comprising:
a low voltage terminal;
a transconductance cell having an input electrically coupled to the low voltage terminal; and
a transmission switch electrically coupled between said connection terminal and said low voltage terminal.

12. The transmission channel according to claim 9, wherein the low voltage decoupling block includes:
first and second substrate terminals;
first and second parasitic capacitive elements electrically coupled to said first and second substrate terminals; and
a first decoupling transistor and a second decoupling transistor electrically coupled in parallel to each other and having control terminals electrically coupled to said first and second parasitic capacitive elements, respectively.

13. The transmission channel according to claim 12, wherein said low voltage decoupling block comprises an input resistive element electrically coupled between said first intermediate node and a second intermediate node, said first decoupling transistor is electrically coupled between said second intermediate node and a third intermediate node; and said second decoupling transistor is electrically coupled in parallel to said first decoupling transistor between said second and third intermediate nodes.

14. The transmission channel according to claim 13, wherein:
said first decoupling transistor has a control terminal electrically coupled to a fourth intermediate node;
the decoupling block includes a first decoupling resistive element electrically coupled between said first substrate terminal and said third intermediate node;
said second decoupling terminal has a control terminal electrically coupled to a fifth intermediate node; and
the decoupling block includes a second decoupling resistive element electrically coupled between said second substrate terminal and said second intermediate node.

15. The transmission channel according to claim 12, wherein said first decoupling transistor is a diode-configured low voltage N channel MOS transistor and said second decoupling transistor is a diode-configured low voltage P channel MOS transistor.

16. The transmission channel according to claim 12, wherein the low voltage isolation switch includes an SOI substrate, said first and second parasitic capacitive elements include doped wells implanted in said SOI substrate, respectively.

17. The transmission channel according to claim 9, wherein said diode block comprises first and second transmission diodes electrically coupled in antiparallel between said input and output terminals.

18. The transmission channel according to claim 9, wherein:
the driving block includes a first driving diode coupled in series with the first driving transistor between the first voltage reference terminal and the first intermediate node;
the driving block includes a second driving diode coupled in series with the second driving transistor between the second voltage reference terminal and the first intermediate node;
said first driving transistor of said driving block has a control terminal configured to receive a first driving signal;
said second driving transistor has a control terminal; and said driving block includes a level shifter coupled to the control terminal of the second driving transistor and configured to receive a second driving signal.

19. A method for driving a transmission channel, comprising:
   transmitting a high voltage signal via a connection terminal to a load, the transmitting including:
      receiving the high voltage signal at an input terminal;
      turning on a matrix of high voltage switches of the transmission channel, the matrix being electrically coupled between the input terminal and a high voltage terminal;
      transmitting the high voltage signal through the matrix;
      transmitting said high voltage signal through a low voltage isolation switch that includes a driving block, having first and second drive transistors coupled to each other by a first intermediate node; a diode block; a control transistor electrically coupled across the diode block and having a control terminal; and a low voltage decoupling block coupled between the first intermediate node and the control terminal of the control transistor, wherein transmitting said high voltage signal through the low voltage isolation switch includes transmitting said high voltage signal through said diode block.

20. The driving method according to claim 19, comprising:
   prior to transmitting the high voltage signal via the connection terminal to the load, switching off said control transistor by turning on said second driving transistor of said driving block; and
   turning off the first and second driving transistors before transmitting the high voltage signal through the diode block, wherein the diode block includes first and second transmission diodes coupled to each other in antiparallel.

21. The driving method according to claim 19, wherein:
   the low voltage decoupling block includes:
      first and second substrate terminals;
      first and second parasitic capacitive elements electrically coupled to said first and second substrate terminals; and
      a first decoupling transistor and a second decoupling transistor electrically coupled in parallel to each other and having control terminals electrically coupled to said first and second parasitic capacitive elements, respectively; and
   transmitting said high voltage signal through the low voltage isolation switch includes:
      turning on said second decoupling transistor on positive edges of said high voltage signal by activating a control terminal of the second decoupling transistor in response to a charge current flowing in said second parasitic capacitive element;
      turning on said first decoupling transistor on negative edges of said high voltage signal by activating a control terminal of the first decoupling transistor in response to a charge current flowing in said first parasitic capacitive element.

22. The driving method according to claim 19, comprising a first receiving mode that includes:
   turning off said matrix of high voltage switches and said low voltage isolation switch;
   turning on a transmission switch coupled between the connection terminal and a transconductance cell;
   receiving a first echo signal at the connection terminal; and
   transmitting said first echo signal from said connection terminal through said transmission switch to said transconductance cell.

23. The driving method according to claim 22, comprising:
   prior to said first receiving mode, switching off said control transistor and the first driving transistor and switching on said second driving transistor.

24. The driving method according to claim 22, comprising a second receiving mode that includes:
   turning on said matrix of high voltage switches and said low voltage isolation switch;
   turning off the transmission switch;
   receiving a second echo signal at the connection terminal; and
   transmitting said second echo signal from said connection terminal through the low voltage decoupling block and said matrix of switches to said input terminal.

25. The driving method according to claim 24, wherein the method includes, in said second receiving mode, turning on said control transistor and said first driving transistor is turned on and turning off said second driving transistor while said transmission switch is kept open so that said second echo signal reaches the matrix of switches through said control transistor.

* * * * *